(12) United States Patent
Katano et al.

(10) Patent No.: US 9,051,644 B2
(45) Date of Patent: Jun. 9, 2015

(54) THIN-FILM MANUFACTURING METHOD AND APPARATUS

(75) Inventors: Tomonori Katano, Kawasaki (JP); Katsumi Taniguchi, Kawasaki (JP); Kungen Teii, Fukuoka (JP)

(73) Assignees: Fuji Electric Co., Ltd., Kawasaki-shi (JP); Kyushu University, National University Corporation, Fukuoka-shi (JP)

( * ) Notice: Subject to any disclaimer, the term of this patent is extended or adjusted under 35 U.S.C. 154(b) by 0 days.

(21) Appl. No.: 13/243,044

(22) Filed: Sep. 23, 2011

(65) Prior Publication Data

US 2012/0107524 A1 May 3, 2012

(30) Foreign Application Priority Data

Nov. 2, 2010 (JP) ................................ 2010-246359

(51) Int. Cl.

| C23C 16/50 | (2006.01) |
|---|---|
| C23C 16/26 | (2006.01) |
| C23C 16/511 | (2006.01) |
| C23C 16/44 | (2006.01) |
| C23C 16/513 | (2006.01) |
| H01J 37/32 | (2006.01) |

(52) U.S. Cl.
CPC .............. *C23C 16/26* (2013.01); *C23C 16/511* (2013.01); *C23C 16/4412* (2013.01); *C23C 16/513* (2013.01); *H01J 37/32422* (2013.01); *H01J 37/32458* (2013.01); *H01J 37/3266* (2013.01); *H01J 37/32834* (2013.01)
USPC ......... 427/571; 427/569; 427/577; 118/723 R (58) Field of Classification Search
CPC combination set(s) only.
See application file for complete search history.

(56) References Cited

U.S. PATENT DOCUMENTS

| 5,514,477 A * | 5/1996 | Ohashi et al. ................. 428/457 |
| 5,785,825 A * | 7/1998 | Hwang et al. ............ 204/192.16 |
| 6,368,678 B1 * | 4/2002 | Bluck et al. ................... 427/569 |
| 2009/0026067 A1 * | 1/2009 | Shiina ..................... 204/192.38 |

FOREIGN PATENT DOCUMENTS

| JP | 06-184733 | 7/1994 |
| JP | A5 H06-184733 | 10/1998 |
| JP | 2001-209929 A | 8/2001 |
| JP | 2002-069621 | 3/2002 |
| JP | 2006-274294 | * 10/2006 |
| JP | 2008-091022 | 4/2008 |

OTHER PUBLICATIONS

Kurihara, JP2001-20929, Eng. Mach. Translation.*
Takigawa, JP2006-274294, Eng machine translation, Oct. 2006.*
Takikawa et al., "DLC thin film preparation by cathodic arc deposition with a super droplet-free system," Surface and Coatings Technology, 163-164, pp. 368-373 (2003).
Office Action in Japanese Patent Application No. 2010-246359, dated Feb. 25, 2014.

* cited by examiner

*Primary Examiner* — Joseph Miller, Jr.
(74) *Attorney, Agent, or Firm* — Venable LLP; Steven J. Schwarz; Tamatane J. Aga (57) ABSTRACT

A thin-film manufacturing method includes the steps of: generating a plasma from source gas; extracting ions from the plasma; and depositing a thin film on one side or both sides of a substrate to be deposited with the ions. The method is performed in an apparatus including: a plasma chamber generating the plasma; a film deposition chamber accommodating the substrate to be deposited; an ion transfer path for transferring the ions from the plasma chamber to the film deposition chamber; a branch pipe branching from the ion transfer path; and an exhaust system connected to the branch pipe. The thin film is formed while the source gas except the ions is exhausted from the branch pipe.

11 Claims, 5 Drawing Sheets

THIN-FILM MANUFACTURING METHOD AND APPARATUS

CROSS-REFERENCE TO RELATED APPLICATIONS

This application claims the benefit of Japanese Patent Application No. 2010-246359, filed Nov. 2, 2010, which is hereby incorporated by reference herein in its entirety.

BACKGROUND OF THE INVENTION

1. Field of the Invention

The present invention relates to a thin-film manufacturing method and apparatus for depositing a thin film on a substrate to be deposited, and, in particular, relates to a thin-film manufacturing method and apparatus used for a recording device (specifically, hard disk device) or the like mounted in an information recording apparatus of information processing equipment such as a computer and also mounted in a consumer product.

2. Description of the Related Art

Recently, recording capacity of an information recording device is increasing, as an information volume treated by information processing equipment such as a computer is increasing and the size of the information processing equipment is reducing. Along with this trend, a recording capacity required for a magnetic recording medium used in the information recording device is increasing continuously. To increase the recording capacity of the magnetic recording medium for improving recording capability, it is necessary to reduce a distance between a read-write element of a magnetic head and a magnetic layer of the magnetic recording medium, that is, a magnetic spacing, to the limit. The magnetic spacing is determined by a thickness of a protection layer of the magnetic head, a floating amount of the magnetic head, thicknesses of the protection layer and a lubricating layer of the magnetic recording medium, and the like.

One subject for developing the magnetic recording medium is to reduce the protection layer thickness. The protection layer of the magnetic recording medium typically employs DLC (Diamond-Like Carbon), which is formed mainly by a chemical vapor deposition (hereinafter, CVD) method or the like. The thickness of the protection layer of the magnetic recording medium has been reduced down to approximately 3 nm, but further reduction is required in the future.

As an alternative method of forming the DLC protection layer, a filtered cathodic arc method (hereinafter, FCA) and its improved method are proposed (see, e.g., Japanese Patent Laid-Open No. 2001-209929). In the FCA method, only carbon ions generated by arc discharge are selected using a mass filter and guided to a substrate to be deposited to form a DLC film. In the above described improved method, the carbon ions are produced by generating a gas-phase plasma instead of the arc discharge. There is also proposed a method of capturing a large amount of particles generated in the FCA method on the way of an ion transfer path (see, e.g., Surface and coatings 163-164 (2003) P. 368-373).

To reduce the thickness of the protection layer of the magnetic recording medium, it is necessary to solve conventional problems regarding an initial growth layer as follows.

In the magnetic recording medium, a protection layer including DLC is formed on a magnetic layer. When the protection layer is formed on a boundary surface of an under layer made of a different material in this manner, plural nuclei are first generated in the state of dots on the under layer boundary surface, and then these plural nuclei grow to form island shapes, in the initial growth process. Up to this step, the layer is called an initial growth layer and the thickness thereof is considered to be approximately 0.5 to 1.0 nm. These island-like nuclei are gradually connected with one another to form a uniform normal layer. The initial growth layer is inferior to the normal layer in material fineness. As described above, the thickness is very small as approximately 3 nm in the case of the protection layer of the magnetic recording medium. For example, if the thickness is reduced down to two third of the current thickness, that is, approximately 2 nm, and the thickness of the current initial growth layer is assumed to be approximately 1 nm, a half of the protection layer is the initial growth layer which is inferior in the material fineness. Such a layer cannot satisfy corrosion resistance and abrasion resistance required for the protection layer.

Meanwhile, when the thin film as described above is formed, there exist mainly two kinds of mechanisms. One is film deposition with radicals, and the other is film deposition with ions. In the former case of the radical film deposition, the film is formed by so-called surface reaction, which results in the above described island-like growth. This is because the radicals do not have large energy. On the other hand, in the latter case of the ion film deposition, the ions are driven into the surface of the substrate to be deposited by energy provided by an electric field or the like. As a result of a so-called ion bombardment effect, the film is formed as precipitated under the surface. Specifically, since the ion film deposition does not include an initial growth layer such as the island-like growth, application of an appropriate energy allows to form a fine film in which a sp3 structure component of a diamond structure is rich in the case of the DLC, for example. If the ions are used for film deposition, it is possible to reduce the thickness of the protection layer, since the protection film is densified.

However, in a typical plasma CVD method, generated plasma includes a large amount of radicals in addition to the ions. Accordingly, this method does not provide a pure ion film deposition but provides a mixture film deposition state in which the ion film deposition and the radical film deposition exist together. Since such results in forming the initial growth layer, it was difficult to reduce the film thickness. Further, the FCA method is already known to be a method of forming a DLC layer which does not include the initial growth layer as a result of the pure ion film deposition. However, since a large amount of particles are generated by arc discharge, it has been difficult to apply the FCA method to the deposition of a protection layer of the magnetic recording medium.

SUMMARY OF THE INVENTION

A subject of the present invention is to provide a thin-film manufacturing method and apparatus which are capable of depositing a sufficiently fine thin film. Another subject of the present invention is to provide a thin-film manufacturing method and apparatus which are capable of depositing a thin film depending on a required film deposition characteristic and a process condition.

A thin-film manufacturing method of the present invention includes the steps of: generating a plasma from source gas; extracting ions from the plasma; and depositing a thin film on at least one side of a substrate to be deposited with the ions. The method is performed in an apparatus having: a plasma chamber generating the plasma; a film deposition chamber accommodating the substrate to be deposited; an ion transfer path for transferring the ions from the plasma chamber to the film deposition chamber; a branch pipe branching from the ion transfer path; and an exhaust system connected to the branch pipe, and the thin film is formed while the source gas except the ions is being exhausted from the branch pipe.

Preferably, the ion transfer path is configured with er of a bent and a curved pipe.

Further, preferably a magnetic field generating means is attached to the ion transfer path and a magnetic flux is formed extending from the plasma chamber to the film deposition chamber.

Further, preferably the magnetic field generating means is either of an electro-magnetic coil and a magnet disposed outside or inside the pipe composing the ion transfer path so as to surround the cross section of the pipe.

Further, preferably the branch pipe is disposed linearly in a direction of extracting ions from the plasma chamber.

Further, preferably the apparatus includes one set of the plasma chamber, the ion transfer path, and the branch pipe, the ion transfer path is connected to one side of the film deposition chamber, and the thin film is formed on one side of the substrate to be deposited.

Further, preferably the apparatus includes two sets of the plasma chambers, the ion transfer paths, and the branch pipes, the ion transfer paths are connected to sides facing each other in the film deposition chamber, respectively, and the thin films are formed on both sides of the substrate to be deposited, respectively.

In this case, preferably magnetic fluxes having the same direction are formed in the ion transfer paths, respectively.

Alternatively, preferably magnetic fluxes having the directions opposite to each other are formed in the ion transfer paths, respectively.

Further, preferably the plasma has a density not less than $10^{10}/cm^3$.

Further, preferably the plasma of a gas selected from a group consisting of oxygen, nitrogen oxide, and argon and helium is generated for each film deposition of one time or plural times in order to remove deposited material and dust in the plasma chamber, the ion transfer path, the branch pipe, and the film deposition chamber.

A thin-film manufacturing apparatus of the present invention includes; a plasma chamber generating a plasma from source gas; a film deposition chamber accommodating a substrate to be deposited; an ion transfer path for transferring ions from the plasma chamber to the film deposition chamber; a branch pipe branching from the ion transfer path; and an exhaust system connected to the branch pipe.

In this case, preferably the ion transfer path is configured with er of a bent pipe and a curved pipe.

Further, preferably a magnetic field generating means is attached to the ion transfer path for generating a magnetic flux extending from the plasma chamber to the film deposition chamber.

Further, preferably the magnetic field generating means is either of an electro-magnetic coil and a magnet disposed outside or inside the pipe composing the ion transfer path so as to surround the cross section of the pipe.

Further, preferably the branch pipe is disposed linearly in a direction of extracting ions from the plasma chamber.

In this case, preferably the apparatus includes one set of the plasma chamber, the ion transfer path, and the branch pipe, the ion transfer path is connected to one side of the film deposition chamber, and a thin film is formed on one side of the substrate to be deposited.

Alternately, preferably the apparatus includes two sets of the plasma chambers, the ion transfer paths, and the branch pipes, the ion transfer paths are connected to sides facing each other in the film deposition chamber, respectively, and thin films are formed on both sides of the substrate to be deposited, respectively.

According to the above described constitution of the invention, it is possible to mainly use ions to perform film deposition on a substrate to be deposited and to obtain a sufficiently fine protection layer. Differently from the present invention, if the exhaust system is not connected to the ion transfer path via the branch pipe as in a conventional art, or if a thin film is formed while the source gas except the ions is not exhausted from the branch pipe, particles adhere to a wall surface. In such a case, the adhered particles due to long time use are peeled off and adhere to the substrate to be deposited, which causes surface defects. Therefore, the present invention can reduce the surface defects in the film deposition compared to the conventional art.

It is particularly important in the apparatus of the present invention that the exhaust system is connected to the branch pipe. Further, it is particularly important in the method of the present invention that a thin film is formed while the source gas except the extracted ions is being exhausted from the branch pipe. Typically, the source gas (radicals and particles, in particular) except the extracted ions is exhausted linearly in the same direction as the direction of extracting ions from the plasma chamber. Therefore, when a DLC layer is formed, for example, the initial growth layer such as an island-like growth caused by the radical film deposition is eliminated and a fine film can be formed, and accordingly it is possible to reduce the thickness of the protection layer. Further, it is possible to perform the deposition of the DLC layer in a state of a reduced amount of radicals and particles.

Preferably the apparatus includes two sets (one pair) of the plasma chambers, the ion transfer paths, and the branch pipes, and the ion transfer paths are connected to sides facing each other in the deposition chamber, respectively. In this case, deposition of thin films on both surfaces of a substrate to be deposited allows to obtain a film deposition state depending on a required film deposition characteristic and a process condition on both sides of the substrate to be deposited.

If magnetic fluxes having the same direction are formed in the ion transfer paths, respectively, the transferred ions reach the substrate to be deposited in a high efficiency, and a high film deposition rate can be obtained.

Further, if magnetic fluxes having directions opposite to each other are formed in the ion transfer paths, respectively, the magnetic flux is spread at the substrate to be deposited and improvement can be expected in film deposition distribution.

If the plasma has a density not less than $10^{10}/cm^3$, a sufficient amount of ions exist in the plasma and a sufficiently high film quality and film deposition rate can be obtained.

Further, if the plasma of a gas selected from a group consisting of oxygen, nitrogen oxide, and argon and helium is generated for each film deposition of one time or plural times in order to remove deposited material and dust in the plasma chamber, the ion transfer path, the branch pipe, and the film deposition chamber, it is possible to perform film deposition including a further reduced amount of particles.

Further features of the present invention will become apparent from the following description of exemplary embodiments (with reference to the attached drawings).

DESCRIPTION OF THE EMBODIMENTS

Figure 1:
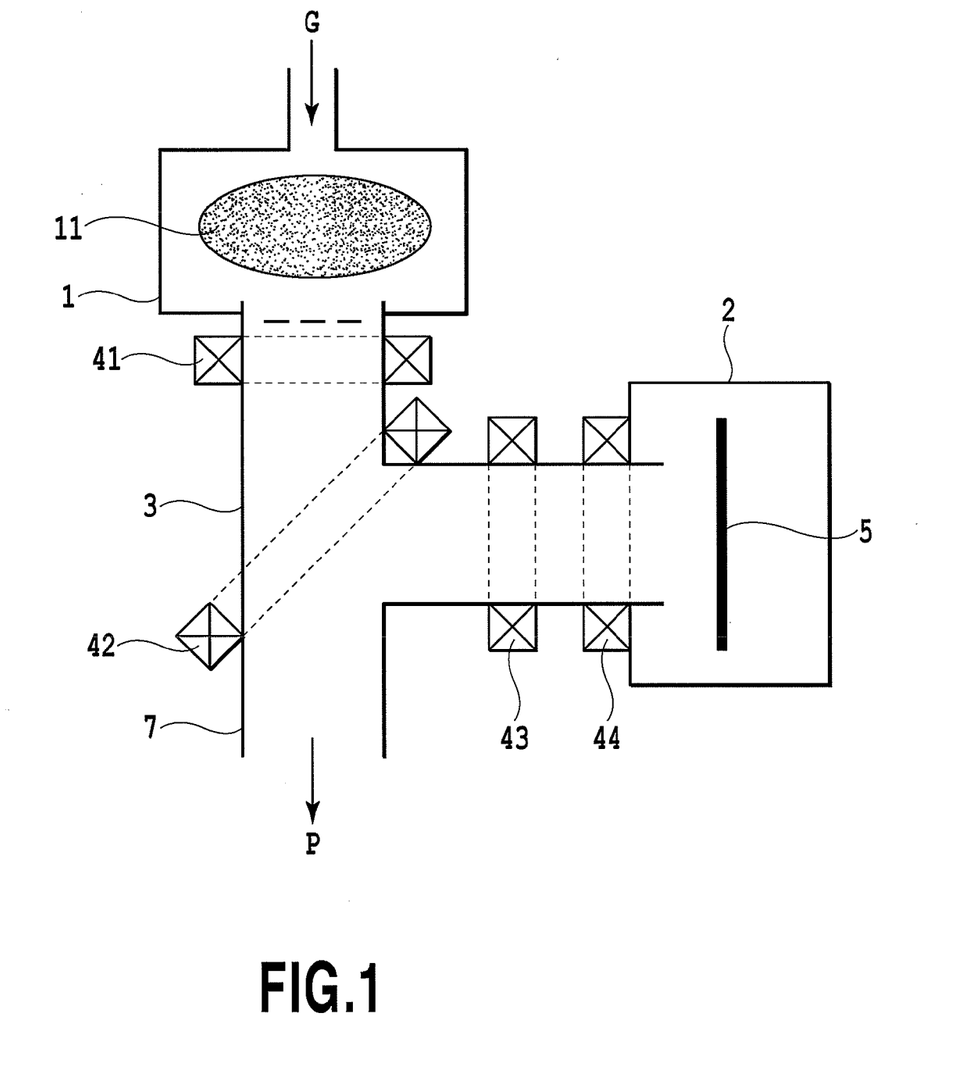
FIG. 1 is a schematic view showing a first example of a method and apparatus of the present invention.

FIG. 1 shows a first example of a film deposition apparatus used preferably for a method of the present invention.

The film deposition apparatus includes a plasma chamber 1 generating a plasma, a film deposition chamber 2, and a bent ion transfer path 3 connecting the plasma chamber 1 and the film deposition chamber 2. The ion transfer path 3 is configured with a bent or curved pipe.

Source gas G is introduced into the plasma chamber 1. In the case of DLC film deposition, hydro-carbon series gas such as ethylene and acetylene is introduced. A plasma 11 is generated in the plasma chamber 1 by an appropriate excitation means which is not shown in the drawing. An method for the excitation means can be appropriately selected among a hot filament method, an inductive coupling type method, an ECR method, and the like.

A substrate to be deposited 5 is formed in the film deposition chamber 2. Ions in the plasma 11 are transferred through the ion transfer path 3. A film is formed on the surface of the substrate to be deposited 5.

The ion transfer path 3 is formed in a pipe structure having a cross section of circle, rectangle, or the like, and a branch pipe 7 is attached to branch from the bent part of the ion transfer pipe 3. One end of the branch pipe 7 is connected to the ion transfer path 3. The other end of the branch pipe 7 is connected to an exhaust system P including an exhaust unit (not shown in the drawing) such as an exhaust pump or the like. The branch pipe 7 is disposed linearly in the direction of extracting ions from the plasma chamber 1. The exhaust system P exhausts the source gas except the ions (radicals and particles, in particular) linearly in the same direction as the direction of ion-extraction. The extracted ions are not introduced into the branch pipe 7 but guided into the film deposition chamber 2. In this case, to make the energized ions reach the film deposition chamber efficiently, pressure is set preferably at approximately 0.01 to 0.4 Pa, for example.

Outside the pipe of the ion transfer path 3, electro-magnetic coils 41 to 44 are disposed as a magnetic field generation means so as to surround the cross section of the pipe. The electro-magnetic coils 41 to 44 generate a magnetic flux extending from the plasma chamber 1 to the film deposition chamber 2 within the pipe of the ion transfer path 3. In this case, the electro-magnetic coils 41 to 44 generate the magnetic fluxes in the same flow direction so as not to cause the magnetic fluxes to cancel out each other but so as to cause the magnetic fluxes to strengthen each other, for example. The magnitude of the magnetic flux can be set at several mT to several hundred mT, for example. If a large current is input into the electro-magnetic coil for applying a high density magnetic flux, the electro-magnetic coil may employ a forced cooling mechanism such as water-cooling or the like. The number of electro-magnetic coils to be disposed, which is four in the present example, can be determined optionally depending on an apparatus configuration, a kind and amount of the ions to be extracted, performance of the electro-magnetic coil, and the like.

Next, the principle of ion-transfer will be explained with reference to FIG. 2.

Figure 2:
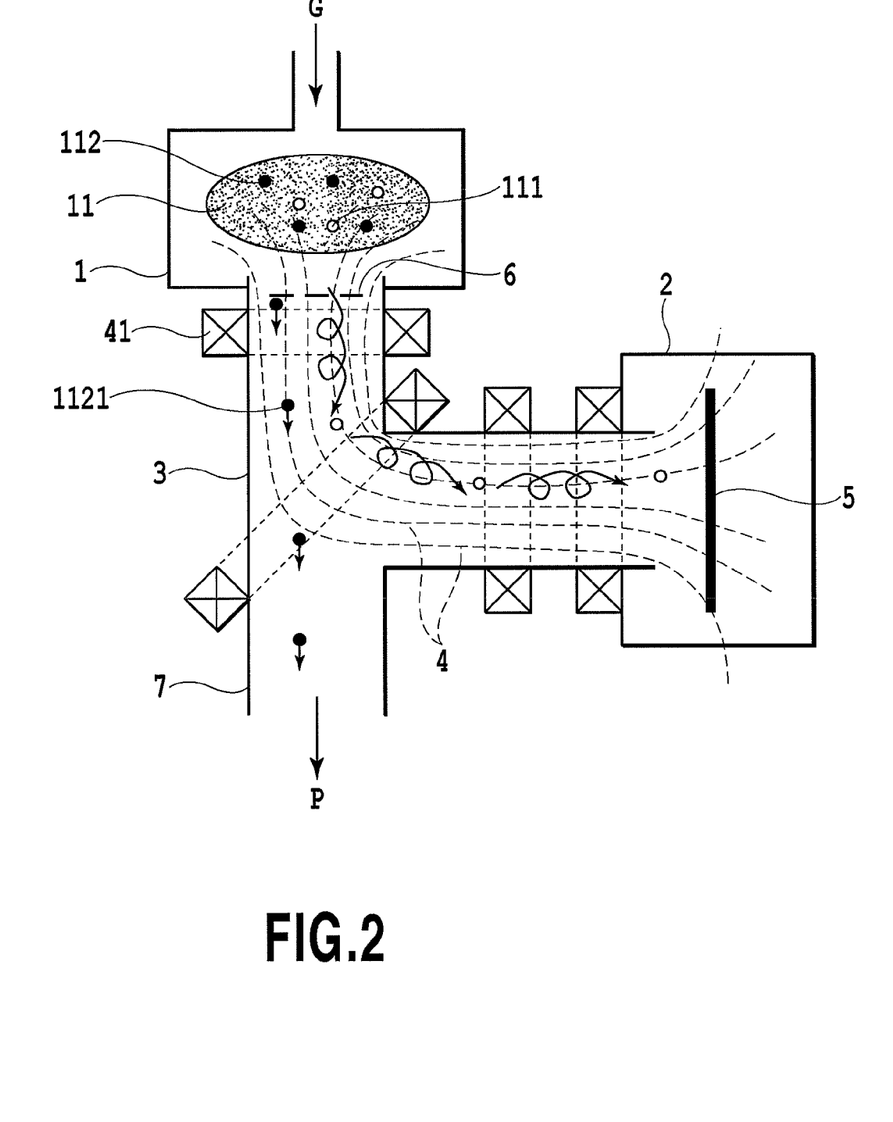
FIG. 2 is a schematic view showing an operation principle for a first example of a method and apparatus of the present invention.

If current is applied in the four electro-magnetic coils in the same rotational direction, a bent magnetic flux 4 can be formed in the ion transfer path 3 extending from the plasma chamber 1 to the film deposition chamber 2 as shown in FIG. 2. While the ion transfer path 3 is bent at a right angle as a whole (or folded at a right angle), the present invention includes a configuration in which the ion transfer path 3 is bent at a preferable angle according to a configuration of the method and the apparatus. Preferably, a right angle is made between the center axis of the pipe part extending from the plasma chamber 1 and the center axis of the pipe part extending from the film deposition chamber 2 using the pipes composing the ion transfer path 3. Alternatively, preferably these pipe parts are configured to be bent at a preferable angle.

The ions 111 flowing into the ion transfer path 3 from the plasma 11 is transferred along the magnetic flux to the substrate to be deposited 5 while accompanying a Larmor circular motion under a Lorentz force. Specifically, the ions 111, which have been extracted from the plasma chamber 2 linearly in the same direction as the direction of ion extraction, travel straight in the ion transfer path 3, bend at a right angle at the position of the branch pipe 7, and reach the substrate to be deposited 5 in the film deposition chamber 2. At this time, if (kinetic) energy of the input ions are not sufficient, the ions need a long time to reach the substrate to be deposited 5, which causes collision to a wall surface and collision between the particles and raises a possibility of ion disappearance. For this reason, a grid-type electrode 6, for example, is disposed between the plasma chamber 1 and the ion transfer path 3, for example, and a voltage of approximately 0 to −200 V, for example, which is lower than the potential of the plasma 11, can be applied in the case of the normal positive ions. This configuration allows to extract the ions from the plasma 11 and to supply the ions to the ion transfer path 3 in a state having sufficient kinetic energy.

Meanwhile, not only the ions 111 but also radicals 112 exist in the plasma 11. The radicals 112 do not have electric charge and basically cannot be guided by the magnetic flux 4 across the bent path to reach the substrate to be deposited 5. Among the radicals 112, the radicals 112 flowing and traveling straight in the branch pipe 7, which works as a duct, are exhausted by the exhaust system (specifically, exhaust pump) P as it is. Further, active radicals are considered basically to be deposited on the wall surface when colliding against it. Few active radicals are considered to be reflected after the collision against the wall surface to reach the substrate to be deposited 5. From these reasons, it becomes possible to form a film mainly with the ions.

If film deposition is performed mainly with the ions, a sufficiently large amount of the ions are required to exist in the plasma 11 for obtaining a sufficiently high film quality and film deposition rate. Preferably, the plasma density is equal to or not less than $10^{10}/cm^3$.

In the foregoing example, the ion transfer path 3 from the plasma chamber 1 to the substrate to be deposited 5 has a bent shape. However, the shape of transfer path 3 may have a curved shape having a curvature at a part or across the whole thereof. Preferably, the center axis of at least part of the pipe composing the ion transfer path 3 is configured to be curved, bent having a curvature, or bent in a bow-shape.

Figure 3:
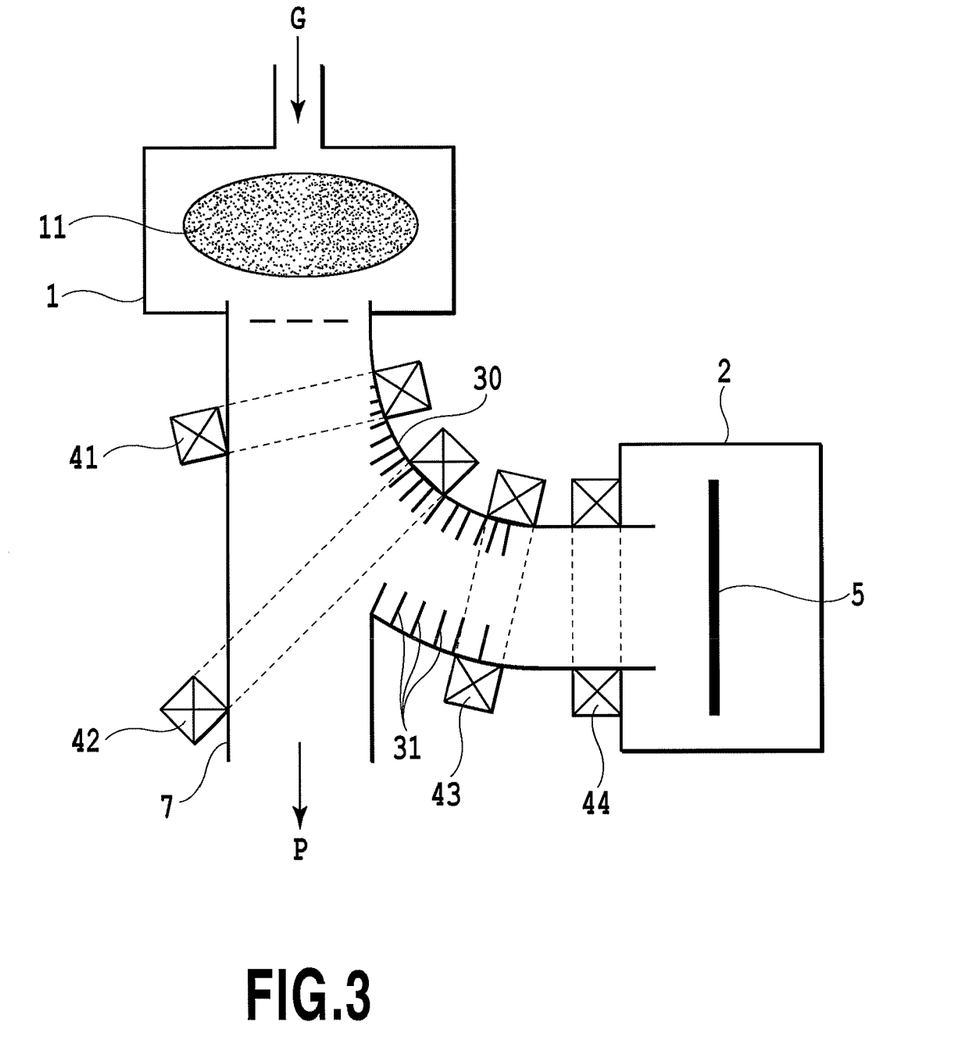
FIG. 3 is a schematic view showing a second example of a method and apparatus of the present invention.

FIG. 3 shows a second example of a film deposition apparatus used preferably for the method of the present invention.

As shown in FIG. 3, for example, a large number of fins 31 are provided on the inner wall of an ion transfer path 30, and the fins 31 capture and adsorb the excess radicals. In this case, as in the foregoing example, it is possible to perform the ion film deposition removing the radicals. FIG. 3 shows an example of adding the fins for a trap. The fins for a trap can be added also to the inner wall of a pipe for the bent ion transfer path, for example.

Figure 4:
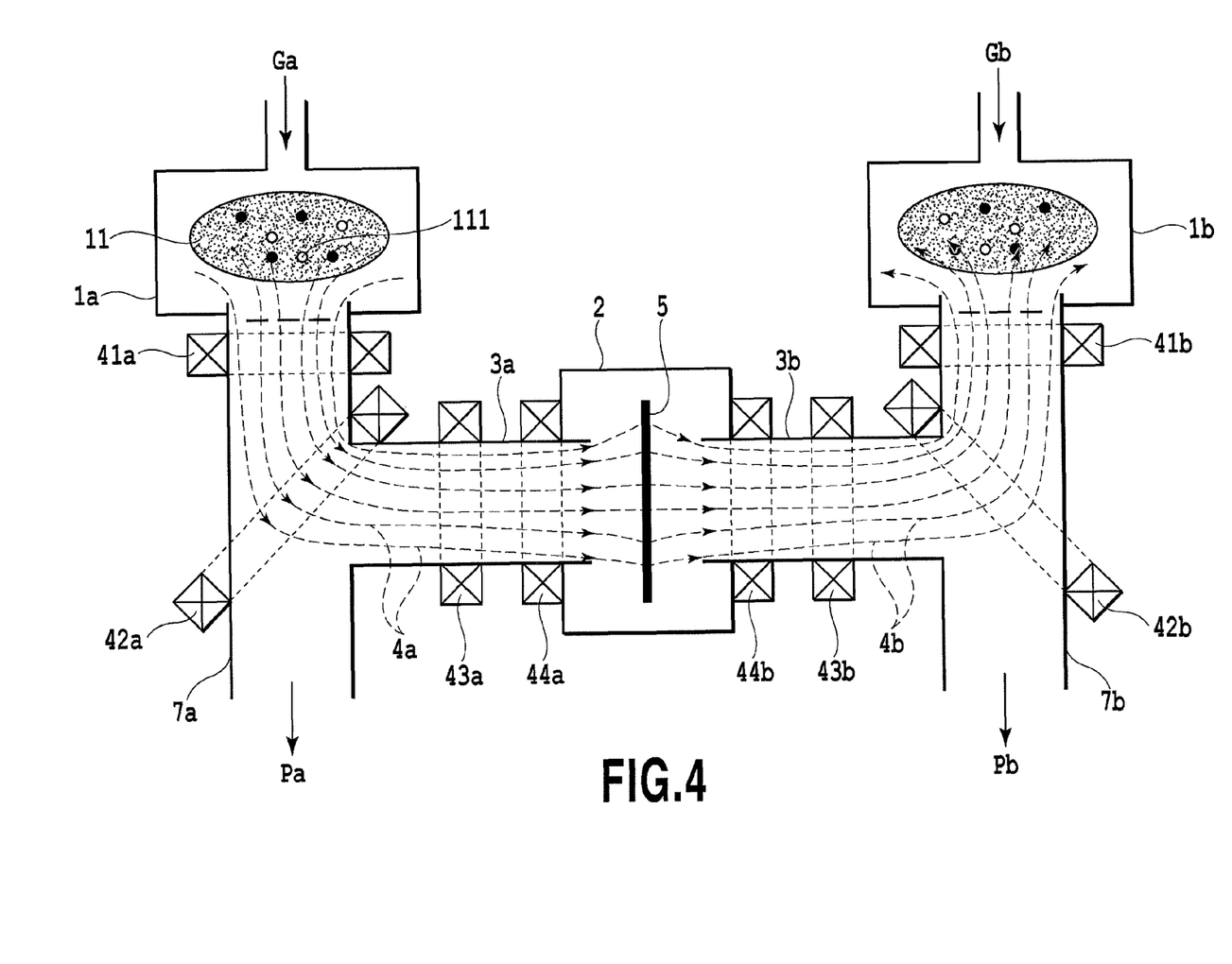
FIG. 4 is a diagram showing a third example of a method and apparatus of the present invention together with a magnetic flux.
Figure 5:
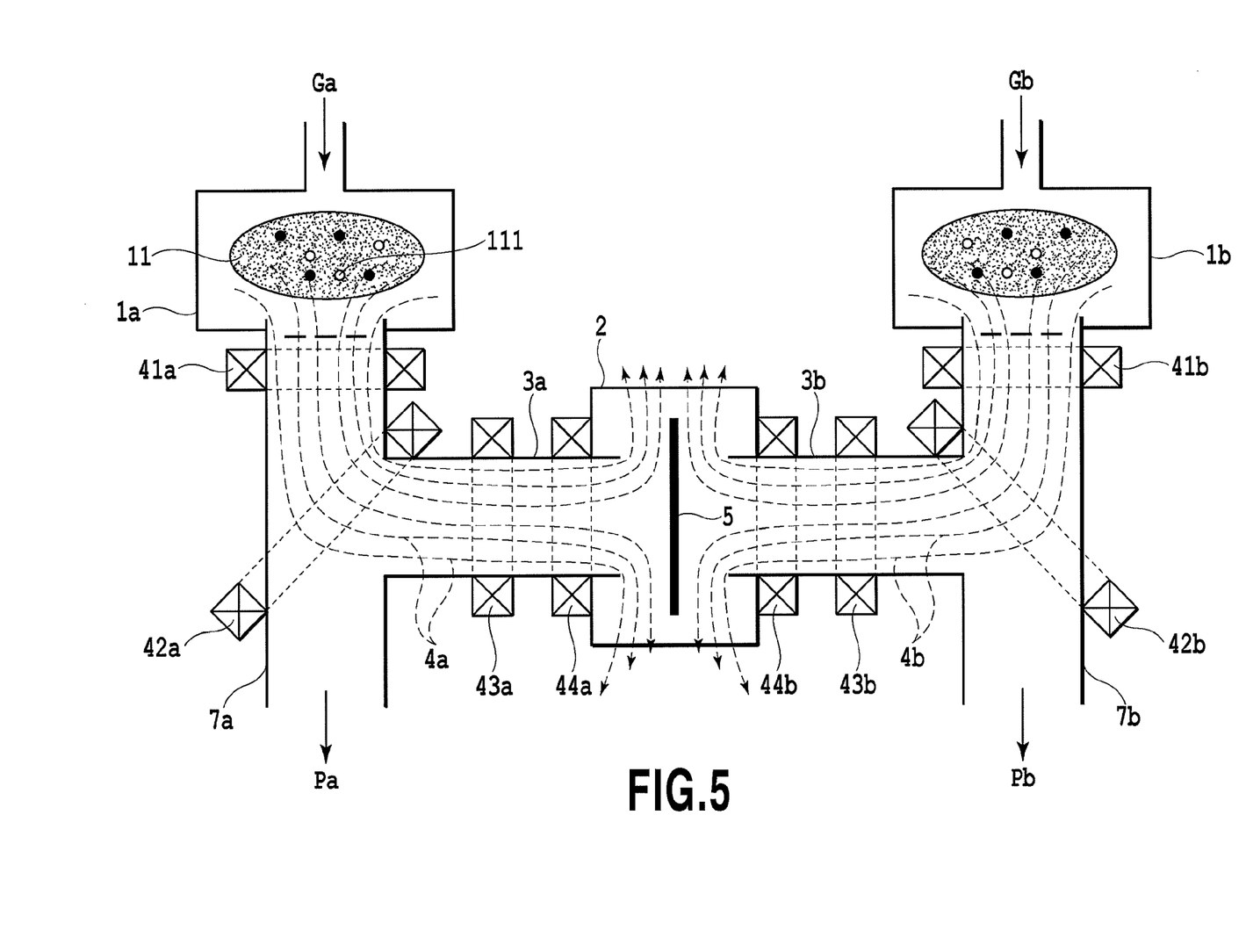
FIG. 5 is a diagram showing a third example of a method and apparatus of the present invention together with a magnetic flux.

FIG. 4 and FIG. 5 show a third example of a film deposition apparatus preferably used for the method of the present invention. Since functions of plasma chambers 1a, 1b, branch pipes 7a, 7b, and exhaust systems Pa, Pb and properties of source gases Ga, Gb are equivalent to the functions of the plasma chamber 1, the branch pipe 7, and the exhaust system P and the property of the source gas G of the first example, respectively, their detailed explanations are omitted.

If ion transfer paths (a first ion transfer path 3a and a second ion transfer path 3b) are provided on both sides of the substrate to be deposited 5, it is possible to select how to combine the direction of a first magnetic flux 4a of the first ion transfer path 3a and the direction of a second magnetic flux 4b of the second ion transfer path 3b, depending on a purpose. FIG. 4 shows the case of aligning the directions of the first magnetic flux 4a and the second magnetic flux 4b. The first magnetic flux 4a and the second magnetic flux 4b flow in one direction, and the magnetic flux spreads narrowly at the substrate to be deposited 5. In this case, the transferred ions reach the substrate to be deposited 5 in a high efficiency, which allows a high deposition rate to be obtained.

However, if the magnetic flux density is high, for example, sometimes the ions gather together around the center of the substrate to be deposited 5 and deposition distribution becomes inhomogeneous. In such a case, as shown in FIG. 5, current is applied to electro-magnetic coils 41a, 42a, 43a, 44a, 41b, 42b, 43b, and 44b so as to cause the first magnetic flux 4a and the second magnetic flux 4b to have directions opposite to each other. In this case, the magnetic flux spreads widely at the substrate to be deposited 5, and the deposition distribution is expected to be improved.

In this manner, in the example shown in FIG. 4 and FIG. 5, it is possible to optionally select the directions of the respective magnetic fluxes flowing in the two ion transfer paths depending on a required deposition characteristic and a process condition and it is possible to obtain a desired film deposition state.

As described above, it is possible to selectively extract the ion particles from the generated plasma and perform the film deposition, according to the film deposition method and apparatus of the present invention. If the exhaust system is not connected to the ion transfer path via the branch pipe as in the conventional art differently from that of the present invention, the particles traveling linearly adhere to the wall surface. In this case, the adhered particles due to long time use are peeled off and adhere to the substrate to be deposited, which causes surface defects. The present invention can provide film deposition in such a condition that the number of surface defects is smaller than that of the conventional art. For example, when depositing a DLC film, it is possible to form a fine film by eliminating the initial growth layer such as the island-like growth caused by the radicals. In this case, it is possible to realize the reduction in the protection layer thickness accordingly. Further, since the plasma is generated from the source gas without the use of arc discharge in which dust such as droplet is easily generated as in the FCA method, it is possible to perform film deposition in a state of a reduced amount of particles. Moreover, if the plasma is generated from a gas such as oxygen, nitrogen oxide, and argon or helium periodically for each film deposition of one time or plural times, it is possible to remove films and dust deposited inside the apparatus and to realize an environment in which particles are hardly generated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A DLC thin-film manufacturing method, comprising the steps of:
    generating a plasma from source gas comprising hydrocarbon series gas;
    extracting carbon ions from the plasma; and
    depositing a DLC thin film on at least one side of a substrate to be deposited with the carbon ions, wherein
    the method is performed in an apparatus having: a plasma chamber generating the plasma; a film deposition chamber accommodating the substrate to be deposited; an ion transfer path for transferring the carbon ions from the plasma chamber to the film deposition chamber; a branch pipe branching from the ion transfer path; and an exhaust pump connected to the branch pipe and extending in the direction of the carbon ions being extracted from the plasma, and wherein
    the DLC thin film is formed while the source gas except the carbon ions is being exhausted from the branch pipe to the exhaust pump linearly in the same direction as the direction of extracting the carbon ions from the plasma chamber.

2. The method according to claim 1, wherein
    the ion transfer path is configured with either of a bent pipe and a curved pipe.

3. The method according to claim 2, wherein
    a magnetic field generating means is attached to the ion transfer path and a magnetic flux is formed extending from the plasma chamber to the film deposition chamber.

4. The method according to claim 3, wherein
    the magnetic field generating means is either of an electro-magnetic coil and a magnet disposed outside or inside the pipe composing the ion transfer path so as to surround the cross section of the pipe.

5. The method according to claim 1, wherein
    the apparatus includes one set of the plasma chamber, the ion transfer path, and the branch pipe,
    the ion transfer path is connected to one side of the film deposition chamber, and
    the DLC thin film is formed on one side of the substrate to be deposited.

6. The method according to claim 1, wherein
    the apparatus includes two sets of the plasma chambers, the ion transfer paths, and the branch pipes,
    the ion transfer paths are connected to sides facing each other in the film deposition chamber, respectively, and
    the DLC thin films are formed on both sides of the substrate to be deposited, respectively.

7. The method according to claim 6, wherein
    magnetic fluxes having the same direction are formed in the ion transfer paths, respectively.

8. The method according to claim 6, wherein
    magnetic fluxes having the directions opposite to each other are formed in the ion transfer paths, respectively.

9. The method according to claim 1, wherein
    the plasma has a density equal to or not less than $10^{10}/cm^3$.

10. The method according to claim 1, further comprising the steps of:
   generating another plasma of a gas selected from a group consisting of oxygen, nitrogen oxide, argon and helium in order to remove deposited material and dust; and
   removing deposited material and dust in the plasma chamber, the ion transfer path, the branch pipe, and the film deposition chamber.

11. The method according to claim 1, wherein
   the plasma is generated from source gas without the use of arc discharge.

* * * * *